United States Patent [19]
Park

[11] Patent Number: 5,982,663
[45] Date of Patent: Nov. 9, 1999

[54] NONVOLATILE SEMICONDUCTOR MEMORY PERFORMING SINGLE BIT AND MULTI-BIT OPERATIONS

[75] Inventor: Jong-Wook Park, Seoul, Rep. of Korea

[73] Assignee: Samsung Electronics, Co., Ltd., Suwon, Rep. of Korea

[21] Appl. No.: 09/010,430

[22] Filed: Jan. 21, 1998

[30] Foreign Application Priority Data

Jan. 21, 1997 [KR] Rep. of Korea .......................... 97-1638

[51] Int. Cl.⁶ .................................................. G11C 16/00
[52] U.S. Cl. ................................ 365/185.09; 365/185.03; 365/185.22
[58] Field of Search .............................. 365/185.09, 200, 365/185.28, 185.11, 185.22, 185.03

[56] References Cited

U.S. PATENT DOCUMENTS

| | | | |
|---|---|---|---|
| 4,780,855 | 10/1988 | Iida et al. ............................ | 365/185.09 |
| 4,998,233 | 3/1991 | Akaogi ................................ | 365/185.09 |
| 5,541,886 | 7/1996 | Hasbun .............................. | 365/185.09 |
| 5,838,610 | 11/1998 | Hashimoto ......................... | 365/185.03 |

*Primary Examiner*—Tan T. Nguyen
*Attorney, Agent, or Firm*—Marger Johnson & McCollom, P.C.

[57] ABSTRACT

The disclosed invention is a nonvolatile memory having a memory field and a redundant field within a single semiconductor chip. The redundant field is used to store essential information regarding device formulation or address mapping. The nonvolatile memory includes a programming circuit capable of programming and verifying a selected memory cell within the redundant field with single-bit data while a selected memory cell within the memory field is being programmed and verified with multi-bit data. The nonvolatile memory also includes a reading circuit capable of reading single-bit data from a selected memory cell within the redundant field while multi-bit data is being read from a selected memory cell within the memory field. Therefore, according to this invention a single-bit operation for the redundant field can be performed without disturbing a multi-bit operation for the memory field.

13 Claims, 12 Drawing Sheets

NONVOLATILE SEMICONDUCTOR MEMORY PERFORMING SINGLE BIT AND MULTI-BIT OPERATIONS

BACKGROUND OF THE INVENTION

This invention relates to nonvolatile semiconductor memories and more particularly to a flash Electrically Erasable and Programmable Read Only Memory (EEPROM) that employs both single-bit and multi-bit memory cell arrays. This invention also relates to the method of performing data operations within the flash EEPROM.

Because of their advanced performance characteristics, including higher programming speeds and lower power consumption, high density nonvolatile memories, particularly flash EEPROMs, have recently proven useful as mass storage devices (or storage media) for portable electronic devices (such as digital still cameras and memory cards) and hard disks in personal computers, among other things. Flash memories are classified into two types, namely, a NAND-type and a NOR-type, in accordance with the logical configuration of the memory cells within the memory. In the NOR-type flash memory, each of the memory cells is connected to a corresponding word line and bit line and is independent of adjacent memory cells. In the NAND-type flash memory, however, each string (which contains multiple memory cells), as opposed to each memory cell individually, is connected to a corresponding bit line through a bit-line contact. Consequently, the NOR-type flash memory requires a greater number of contacts in order to couple the bit lines and memory cells together than the NAND-type flash memory. The NAND-type flash memory is therefore superior to the NOR-type flash memory in integration density.

Industry desires for more efficient integration density in a flash memory and for expanded memory capacity have led to the development of multi-bit (also known as multi-level, multi-state, or multiple bit) technology, wherein a plurality of bits are stored within a single memory cell. By providing for the storage of multiple bits within each memory cell, multi-bit technology contributes to a reduction in the cost-per-bit of data storage in flash memories that employ this technology. One prior art multi-bit configuration is disclosed on pp. 132–133 of the ISSC Digest of Technical Papers dated February 1995, in an article entitled "A Multilevel-Cell 32 Mb Flash Memory," written by M. Bauer, et al. Specifically, this article discloses a cell array arranged in the NOR-type flash memory configuration in which a memory cell uses two bits to store one of four data states, i.e., "00", "01", "10", and "11". Each of these four states corresponds to a unique voltage level, e.g., "00"=2.5V, "01"=1.5V, "10"=0.5V, and "11"=−3V. These voltage levels are threshold values assigned to allow data to be read from a memory cell having one of these four states of data stored therein. Significantly, the memory cell contains a distribution profile corresponding to these various threshold values. Furthermore, memory cells coupled to a single word line can have threshold voltages that differ from each other.

To detect the data state of a memory cell, a read voltage having a voltage level interposed between two threshold voltage levels, or positioned on a lower or higher side of a threshold voltage, must be applied to a gate of each of the memory cells through a word line coupled thereto. Unfortunately, the width between adjacent threshold voltages (hereinafter referred to as a "window") is less than that found in a normal (i.e., single-bit) flash memory. For example, the window in a four-state flash memory is about 0.6V. Furthermore, when a word line voltage for performing a reading operation is located in a window of about 0.6V, the margin between an edge of the threshold voltage profile and the level of the word line voltage may not be more than approximately 0.3V (as opposed to about a 1.3V margin in a single-bit memory). Therefore, when multi-bit flash memories are made using a manufacturing process subject to variations or when they are influenced by variations in word line voltage level and temperature, the probability of having invalid sensing operations becomes significant. This weak immunity against variations in external conditions suggests that the utility of the multi-bit flash memory as a storage device is limited to the storage of mass information, such as audio data, for example, where the failure to store even several data bits does not significantly disturb the organization of the information as a whole. Until now, therefore, single-bit flash memories have been used for storing information where reliability and stability of data storage are important, such as in the Basic Input/Output System (BIOS) or for font storage.

Despite the well-known respective advantages of both the single-bit and the multi-bit flash memories, these two types of flash memories have traditionally been fabricated on separate semiconductor chips. Therefore, the prior art semiconductor chips may only perform either the single-bit or the multi-bit operations within the memory cells of the chip, depending upon the configuration chosen during fabrication.

Figure 1:
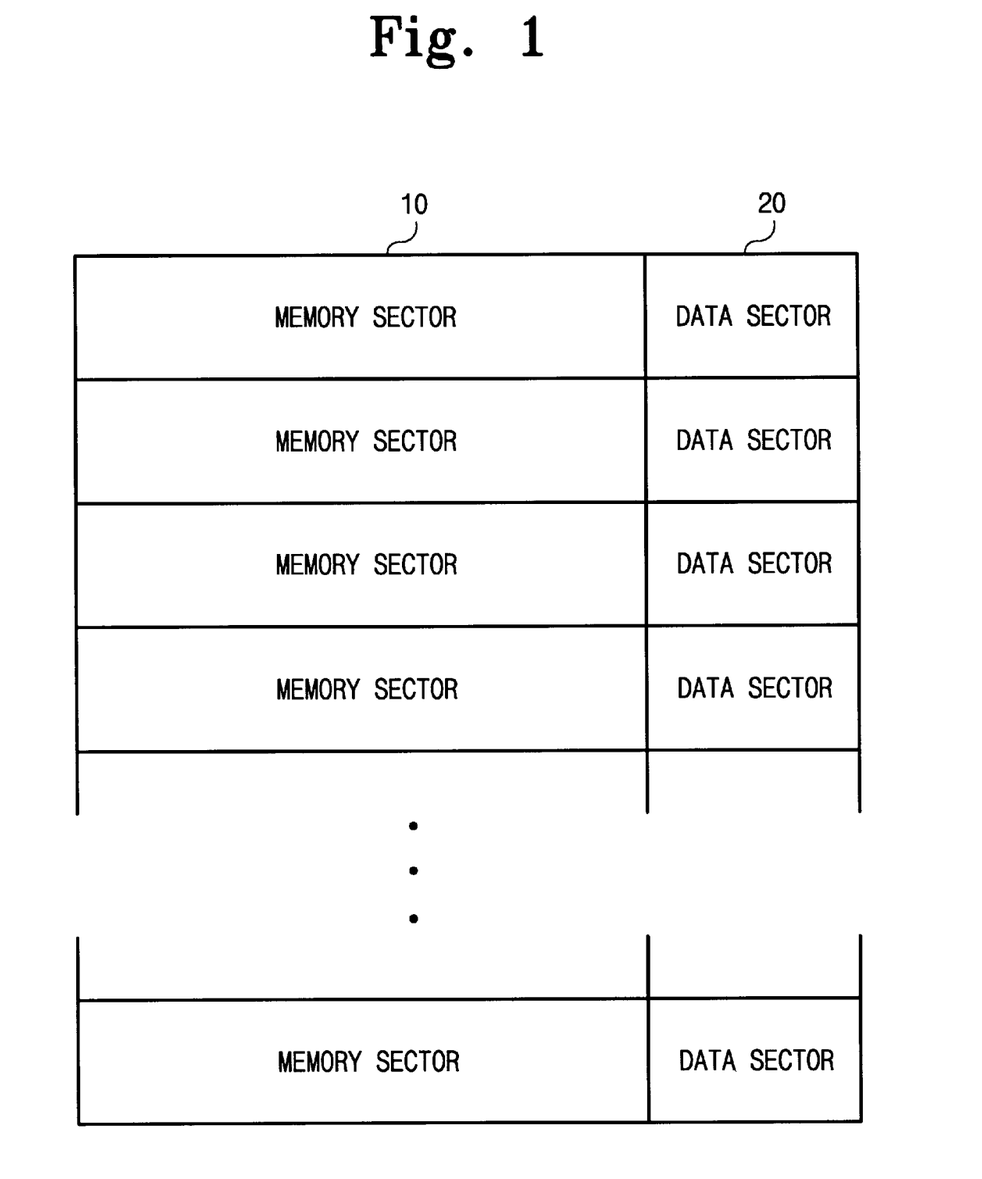
FIG. 1 is a block diagram illustrating a conventional flash memory configuration.

FIG. 1 shows a block diagram of a memory array and data field arranged in a conventional flash memory. A cell array region of the conventional flash memory, as shown in FIG. 1, is divided into two portions; namely, a memory array 10, containing memory sectors, and a device data field 20, containing data sectors corresponding to the memory sectors. Each memory sector includes a normal memory array and a redundant array. The normal memory array is used to store data. The redundant memory array can be substituted for bad portions of the normal memory array within the same sector. Each data sector retains general information about a corresponding memory sector, including such information as the locations of bad sectors in the normal memory array, and an address mapping for data formulation or substitution. Because the data stored in the device data field 20 is extremely important for determining whether an access operation of the memory data is either valid or invalid, the device data field 20 should be located in a stable single-bit retention environment, rather than in an unstable multi-bit retention area, in order to guarantee data stability.

The industry is therefore in need of a flash memory consisting of both single-bit and multi-bit memory cell arrays on a single semiconductor chip, so that important memory information can be reliably stored in a single-bit area, while less critical mass information can be stored in the more highly integrated multi-bit areas. Such a configuration can provide for both the necessary address mapping integrity and the general memory cell information while also providing greater memory capacity in a smaller chip size.

SUMMARY OF THE INVENTION

According to the needs of the industry, it is an object of the present invention to provide a nonvolatile semiconductor chip having both single-bit and multi-bit memory cells embedded within the same chip.

It is yet another object of the present invention to provide a nonvolatile semiconductor memory device that is capable of performing a multi-bit data access operation to obtain data from a multi-bit memory cell array retaining mass data while simultaneously conducting a single-bit data access operation to obtain data within a single-bit device data field retaining important information about the formulation of the memory cell array.

The objects of the present invention are obtained by providing both single-bit and multi-bit memory cell arrays within a single semiconductor chip. The single-bit memory cell arrays are used to reliably contain the essential information regarding the composition of the multi-bit memory cell array, while the multi-bit memory cell array is used to contain less-critical mass information. This improved configuration therefore allows for stable storage of the essential information while also allowing for increased memory storage density.

Specifically, a nonvolatile memory according to the present invention has a memory field having multi-bit memory cells. The memory also includes a device data or redundant field having single-bit memory cells. Both of these fields are incorporated into a single semiconductor chip. Information about device formulation or address mapping is stored in the redundant field, while mass information is stored in the memory field. The nonvolatile memory also includes a programming circuit for programming and verifying information from a selected single-bit memory cell belonging to the redundant field while a selected multi-bit memory cell belonging to the memory field is also being programmed and verified. Finally, the semiconductor memory includes a reading circuit for reading a selected single-bit memory cell belonging to the redundant field while a selected multi-bit memory cell belonging to the memory field is also being read. A latch control circuit determines when the single-bit programming or read operations are activated during a given multi-bit cycle. Therefore, according to the present invention, the single-bit operations can be performed on a redundant field within the same chip as a memory field without disturbing the multi-bit operation of the memory field.

DETAILED DESCRIPTION OF THE PREFERRED EMBODIMENTS

Following is a detailed description of the preferred embodiments of this invention, made with reference to the appended drawings, as described above, in which like reference characters designate like or corresponding parts throughout the drawings.

Figure 2:
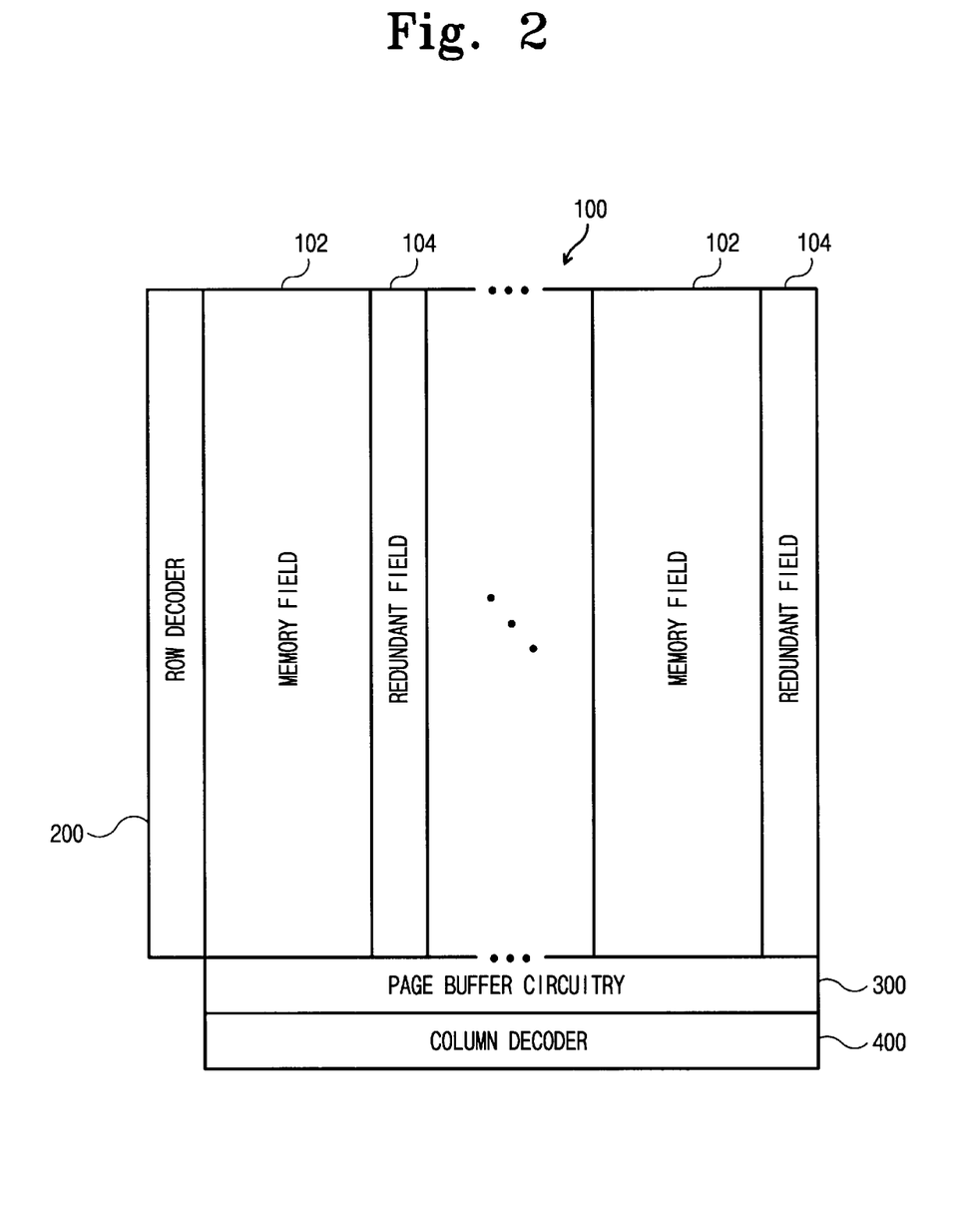
FIG. 2 is a block diagram illustrating an arrangement of a memory array and peripheral circuits of a nonvolatile semiconductor memory capable of performing single and multi-bit operations according to the present invention.

FIG. 2 is a block diagram showing a practical architecture of a memory cell array and peripheral components according to the present invention. Referring to FIG. 2, a memory cell array 100 includes multiple memory fields 102 (substantially equivalent to the memory sectors shown in FIG. 1) and multiple redundant fields 104 (substantially equivalent to the data sectors shown in FIG. 1). Similar to the prior art, each memory field 102 is paired with a corresponding redundant field 104 and each memory field 102 comprises a normal memory cell array and a redundant memory cell array. Also similar to the prior art, each redundant field 104 stores information concerning device formulation, such as the addresses of bad sectors and the status of address mapping. Unlike the prior art, however, the memory field and corresponding redundant field are incorporated into a single semiconductor chip. Furthermore, a page buffer circuit 300a is provided to control appropriate bit lines of the memory cell array 100, in addition to a row decoder 200 that is provided to select appropriate word lines of the memory cell array 100. A detailed construction of the redundant field 104 and its cooperative interconnection with the page buffer circuit 300a will now be disclosed.

The First Preferred Embodiment

Figure 3:
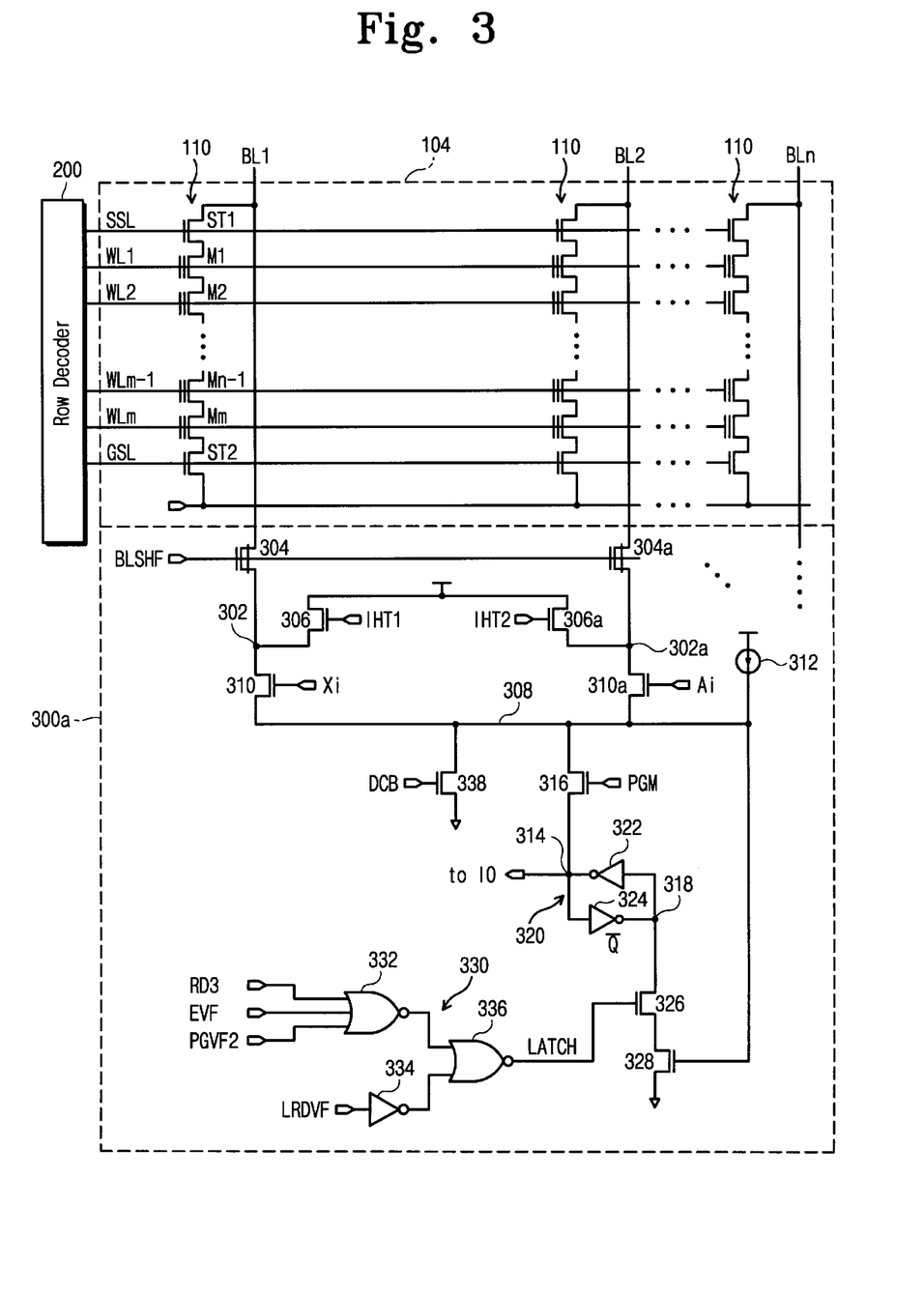
FIG. 3 is a circuit diagram showing a configuration of a redundant field and page buffer circuitry according to a first preferred embodiment of the nonvolatile semiconductor memory shown in FIG. 2.

FIG. 3 is a circuit diagram showing the configuration of a memory cell array of one of the redundant fields 104 and a corresponding page buffer circuit 300a according to a first preferred embodiment. The memory cell array of the redundant field 104 corresponds to a memory sector of the memory field 102 (see FIG. 2). Referring to FIG. 3, each redundant field 104 comprises a plurality of strings 110 configured in a NAND-type flash memory arrangement. Each of the strings is organized having two string selection transistors, ST1 and ST2, and a plurality of memory cells M1 to Mm. Each string is further coupled to a corresponding one of the bit lines BL1 to BLn.

Specifically, in each string 110, the memory cells M1 to Mm are serially connected between two string selection transistors ST1 and ST2. A first string selection transistor ST1 is coupled between the bit line BL1 and a first memory cell M1, while a second string selection transistor ST2 is coupled between a last memory cell Mm and a common source line CSL. A gate of the first string selection transistor ST1 is coupled to a string selection line SSL, while a gate of the second string selection transistor ST2 is connected to a ground selection line GSL. A gate of each of the memory cells M1 to Mm is coupled to a corresponding one of the word lines WL1 to WLm. The string selection line SSL, ground selection line GSL, and word lines WL1 to WLm are connected to outputs of the row decoder 200. The interconnection between the redundant field 104 and the page buffer circuit 300a is described below.

In the page buffer circuit 300a, a first bit line BL1 is connected to a first node 308 through a first NMOS depletion transistor 304 and a first NMOS transistor 310. A second bit line BL2 is similarly connected to the first node 308 through a second NMOS depletion transistor 304a and a second NMOS transistor 310a. Gates of both the first and second NMOS depletion transistors 304 and 304a are coupled in common to a bit line shielding signal BLSHF. A gate of the first NMOS transistor 310 is connected to an address signal Xi while a gate of the second NMOS transistor 310a is coupled to an address signal Ai.

A third NMOS transistor 306, having a gate coupled to a first inhibition signal IHT1, is connected between a power source voltage and a second node 302. The second node is interposed between the first NMOS and the first NMOS depletion transistors 310 and 304. Similarly, between a power source voltage and a third node 302a a fourth NMOS transistor 306a, having a gate coupled to a second inhibition signal IHT2, is connected. The third node is located between the second NMOS transistor 310a and the second NMOS depletion transistor 304a.

A fifth NMOS transistor 338, having a gate coupled to a bit line discharge signal DCB, is connected between the first node 308 and a ground. Constant current is supplied to the first node 308 from the power source voltage through an independent current source 312. The first node 308 is also connected to a first terminal Q of a data latch 320 through a sixth NMOS transistor 316. The sixth NMOS transistor has a gate coupled to a programming signal PGM. The first terminal Q is further connected to an input/output line IO.

A second terminal $\overline{Q}$ is connected to the ground through seventh and eighth NMOS transistors 326 and 328, respectively. The seventh NMOS transistor 326 has a gate coupled to a signal LATCH and the eighth NMOS transistor 328 has a gate connected to the first node 308. The signal LATCH is generated by a first NOR gate 336 of a latch control circuit 330, and is provided to activate data latch 320.

In the latch control circuit 330, a plurality of signals, including a read signal RD3, an erasure verification signal EVF, and a program verification signal PGVF2, are each applied to a respective terminal of a second NOR gate 332. An output of the second NOR gate 332 is applied as a first input to a first NOR gate 336. The inverse of a read verification signal LRDVF is applied as a second input to the first NOR gate 336.

Having described a first preferred configuration of the semiconductor memory, an erasing, programming, and reading operation for the redundant field 104 will now be described. It should be noted that these operations can be performed using the same sequential timing as in a conventional multi-bit cell array.

Figure 4A:
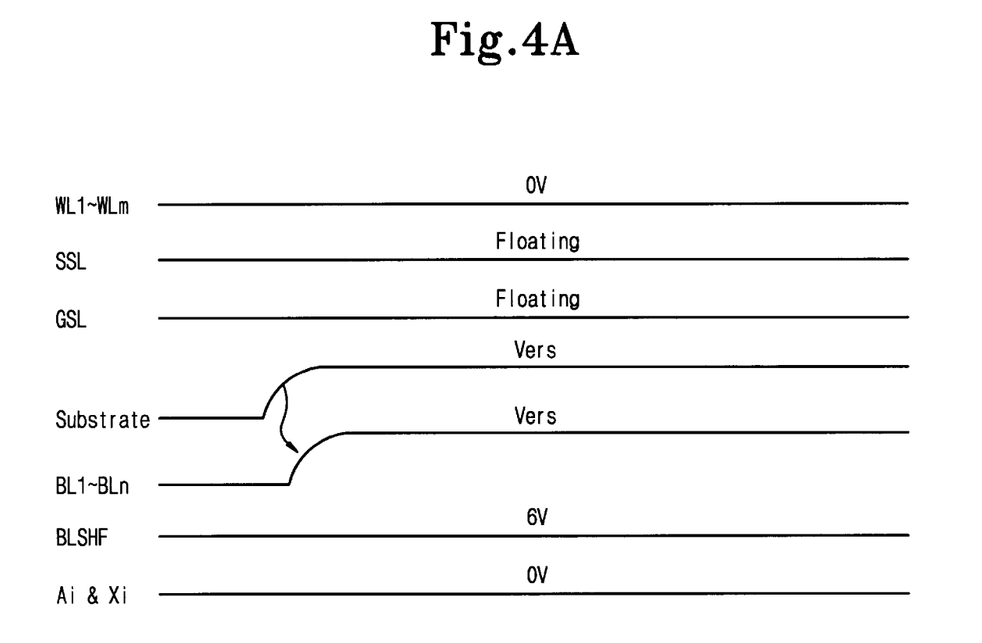
FIG. 4A is a timing diagram showing the timing of an erasure operation of the first preferred embodiment of the present invention shown in FIG. 3.
Figure 4B:
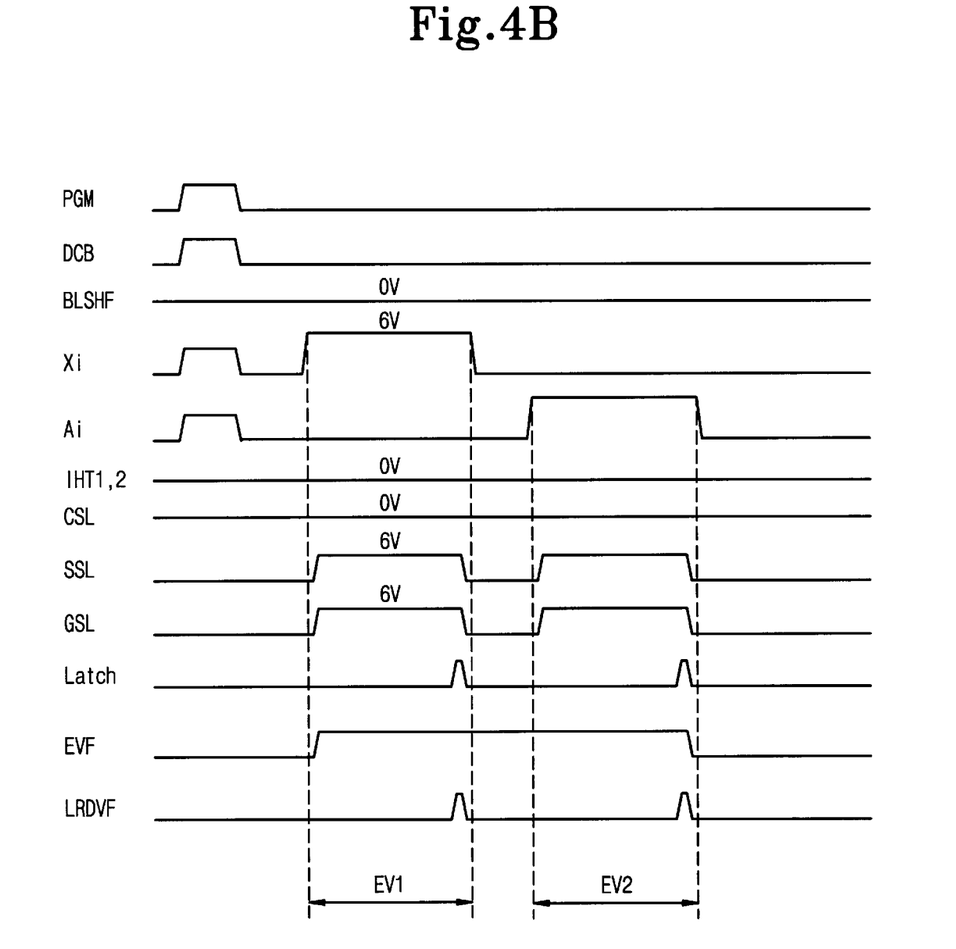
FIG. 4B is a timing diagram showing the timing of an erasure verification operation of the first preferred embodiment of the present invention shown in FIG. 3.

FIGS. 4A and 4B are timing diagrams of erasure and erasure verification operations, respectively, within the first preferred embodiment of the semiconductor memory device of the present invention. Referring to FIG. 4A, in an erasing operation, the source select line SSL and the ground select line GSL are floated, while the word lines are held at a voltage level of 0V. Additionally, the bit line shielding signal BLSHF retains a voltage of about 6V as the address signals are maintained at a voltage level of 0V. An erasure voltage Vers of about 18V to 24V is applied to a substrate (or bulk) in which the memory cells are formed, so that all of the memory cells coupled to the word lines are spontaneously erased.

Now referring to FIGS. 3 and 4B, an erasure verification operation will be described. In an erasure verification operation according to the present invention, the program signal PGM and the bit line discharge signal DCB initiate the data latch 320 with the first terminal Q having data of low level and the second terminal $\overline{Q}$ having data of high level. The verification operation is conducted in two periods EV1 and EV2. The first period EV1 is used for the verification of odd-numbered bit lines (BL1, BL3, etc.) and the second period EV2 is used for verification of even-numbered bit lines (BL2, BL4, etc.).

Specifically, during the first period EV1, the first bit line BL1 is selected by setting address signal Xi to a high level, the source select line SSL and the ground select line GSL are set to a voltage level of 6V, and all of the word lines are held at 0V. If all of the memory cells have been properly erased as on-cells, then the second node 302 goes to a low level signifying an erasure pass state. However, if one or more of the memory cells has not been completely erased (i.e., it remains an off-cell), then the second node 302 remains at a high level, thereby causing the first terminal Q to also be at a high level. When this happens, the signal LATCH is also at the high level and an erasure failure state results.

The verification operation of the even numbered bit lines during the second period EV2 is nearly identical to that of the even numbered bit lines during the first period EV1 and further description of this operation will therefore be omitted.

Referring to FIG. 3, in a programming and a program verification operation of a multiple-bit memory structure, a program voltage of about 14V through 19V is applied to a selected word line. When a selected bit line, i.e. the first bit line BL1, is being put into the programming operation, an unselected bit line, i.e. the second bit line BL2, is coupled to a program inhibit voltage Vcc through the fourth NMOS transistor 306a in response to the second inhibition signal IHT2. As a result, memory cells connected to the selected word line but an unselected bit line will not be influenced by this selective programming.

During the programming operation, the bit line coupled to a selected memory cell is charged to the program inhibit voltage Vcc. This occurs because the first terminal Q of the data latch 320 changes to a high level when a threshold voltage Vt of the selected memory cell being programmed becomes higher than a predetermined reference voltage (e.g., 1.3V). In this manner, the selected memory cell, when completely programmed, will not be influenced by programming operations performed on other memory cells.

According to this invention, the programming and program verification operations for the redundant field 104 are included within a programming sequence of the multi-bit memory cell array of the memory field 102. This allows the single-bit memory operations of the redundant field 104 to be performed at the same time as the multi-bit memory operations of the memory field 104 without disturbing the multi-bit memory operations.

Figure 5:
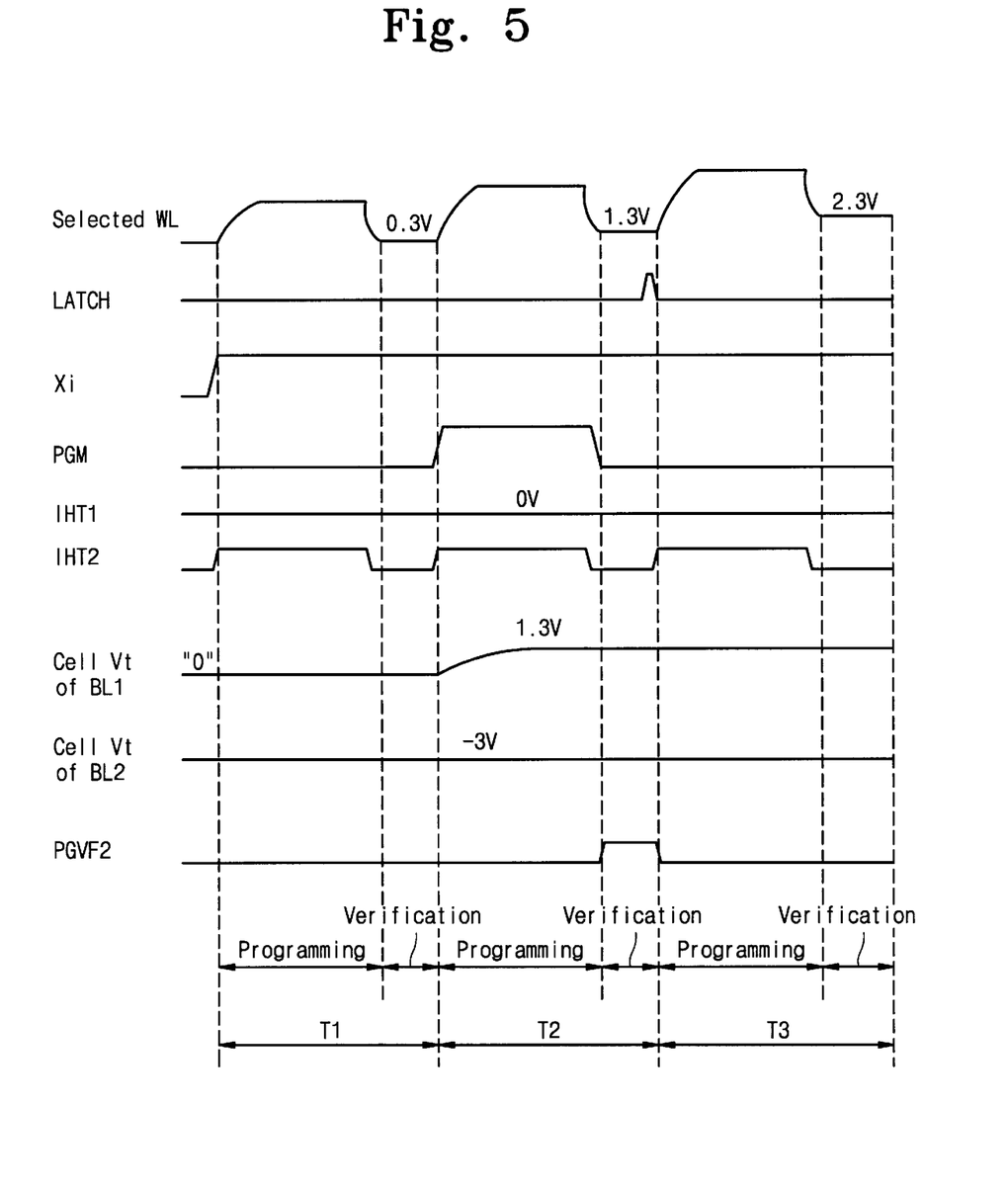
FIG. 5 is a timing diagram illustrating the timing of a programming and a program verification operation of the first preferred embodiment of the present invention shown in FIG. 3.

Referring to FIGS. 3 and 5, a timing flow of a multi-bit programming operation includes three cycles T1, T2, and T3. A second cycle T2 of the multi-bit programming operation is used for performing the programming and program verification operations within the single-bit redundant field 104.

Specifically, during the second cycle T2, a single-bit programming operation is performed for the single-bit memory cells connected to the selected first bit line BL1 in the redundant field 104. The programming operation begins when a programming signal PGM is brought to the high level. Following the programming operation, a program verification operation of the redundant field 104 is also carried out during the second cycle T2. The program verification operation takes place in response to a program verification signal PGVF2 of the high level.

As mentioned earlier, a program voltage of about 14V through 19V is applied to the selected word line during the programming and program verification operations. In addition, the program voltage applied to the selected word line is increased by 0.2V during each of the second and third cycles T2 and T3, respectively. For example, if an initial program voltage was 18V for a first cycle T1, then the program voltage during the second cycle T2 would be 18.2V, and the program voltage during the third cycle T3 would 18.4V. Therefore, the program voltage for the redundant field 104 would become 18.2V. A program verification voltage is 1.3V because a programmed memory cell of the redundant field 104 during the second cycle T2 has a threshold voltage Vt at least higher than 1.3V.

As is well known in the art, the programming and program verification operations may be repeatedly performed until the programmed cell is read out as an off-cell corresponding to a programming pass state. Additionally, according to this invention, the positioning of the single-bit programming operations for the redundant field 104 within the entire sequence of the multi-bit programming operations for the normal memory cell array (or the redundant memory cell array) in the memory field 102 (see FIG. 2), can be modified by varying the programming verification signal PGVFn (where n may be 1, 2, or 3). Variation of the programming verification signal changes a distribution value of the threshold voltage of the programmed cell and alters the timing of the single-bit programming and program verification operations. For example, if a modified program verification signal PGVF3 is applied to the latch control circuit 330, instead of the program verification signal PGVF2, then the single-bit programming and verification operations would be conducted during the third cycle T3 instead of during the second cycle T2.

In this embodiment, the threshold voltage levels Vt stored in the multi-bit memory cells by the multi-bit programming operation are approximately as follows: under −2.7V, from 0.3V to 0.7V, from 1.3V to 1.7V, and from 2.3V to 2.7V. These threshold voltage levels correspond to the data values of "11", "10", "01", and "00", respectively.

Figure 6:
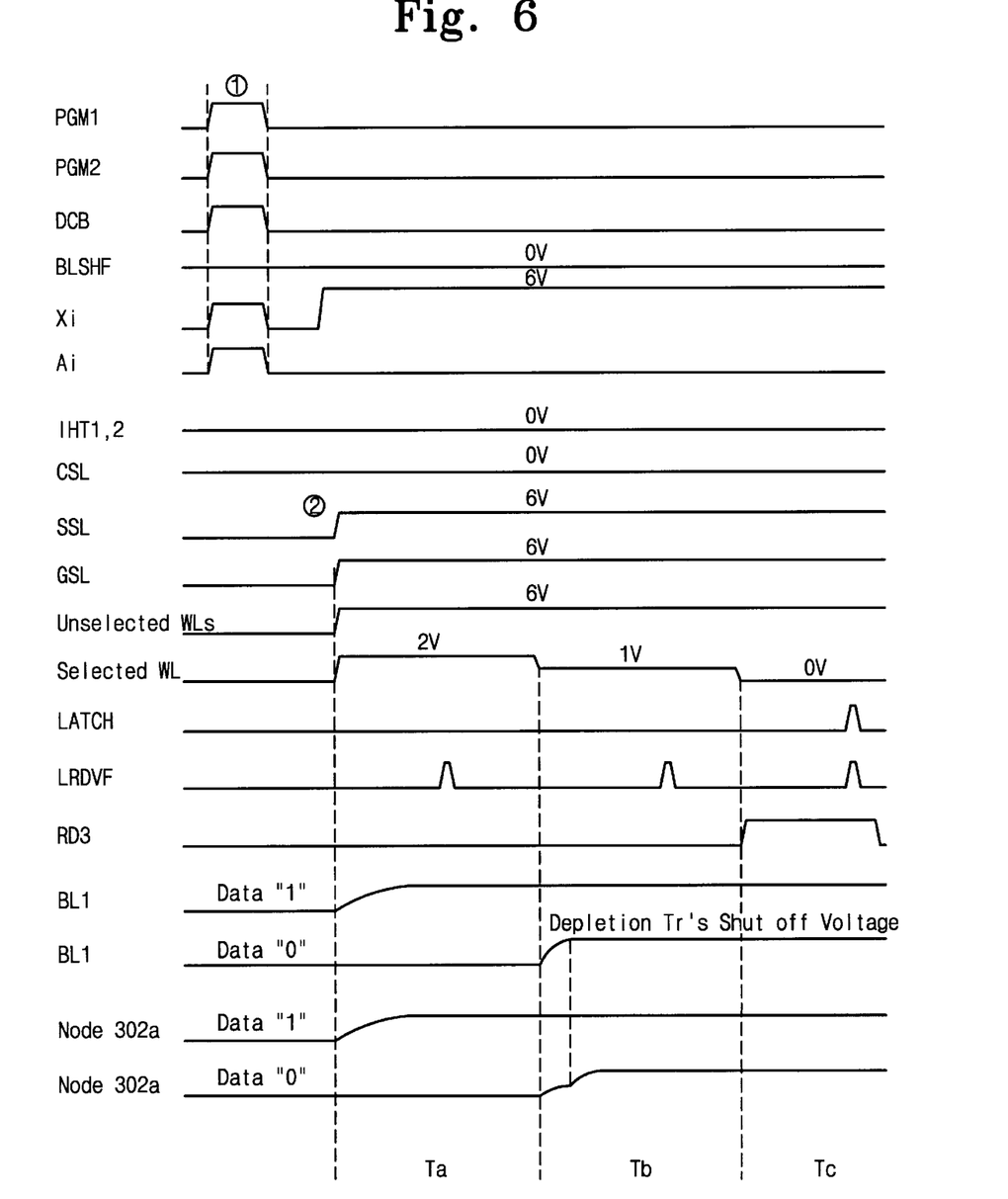
FIG. 6 is a timing diagram illustrating the timing of a read operation of the first preferred embodiment of the present invention shown in FIG. 3.

In a reading operation, the redundant field 104 has a read step that is performed during a multi-bit reading sequence for the normal memory cell array in the memory field 102 (see FIG. 2). Referring to FIGS. 3 and 6, the multi-bit reading sequence for the normal memory cell array includes three cycles Ta, Tb, and Tc, similar to the programming and program verification operations discussed earlier. The read signal RD3, applied to the latch control circuit 330, determines that a single-bit reading operation for the redundant field 104 will be conducted during the third cycle Tc.

During the reading operation, a read voltage of 0V is applied to a selected word line and the common source line CSL, while a voltage of 6V is applied to the unselected word lines, the ground select line GSL, and the source select line SSL. The bit line shielding signal BLSHF and the first and second inhibition signals IHT1 and IHT2 are also maintained at 0V. If the selected bit line, i.e. the first bit line BL1, is at the low level when the voltage level of 0V is applied to the selected word line, then the selected cell is an on-cell and a data state of the first terminal Q becomes high ("1"). However, if the selected cell is detected as an off-cell (i.e., the selected bit line is at the high level), then the data state of the first terminal Q is low ("0"). As in the programming operation, the positioning of the reading operation for the redundant field 104 within the entire multi-bit reading sequence for the normal memory cell array (or redundant cell array), in the memory field 102, can be modified by varying the signal RDn (where n may be 1, 2, or 3).

The Second Preferred Embodiment

Figure 7:
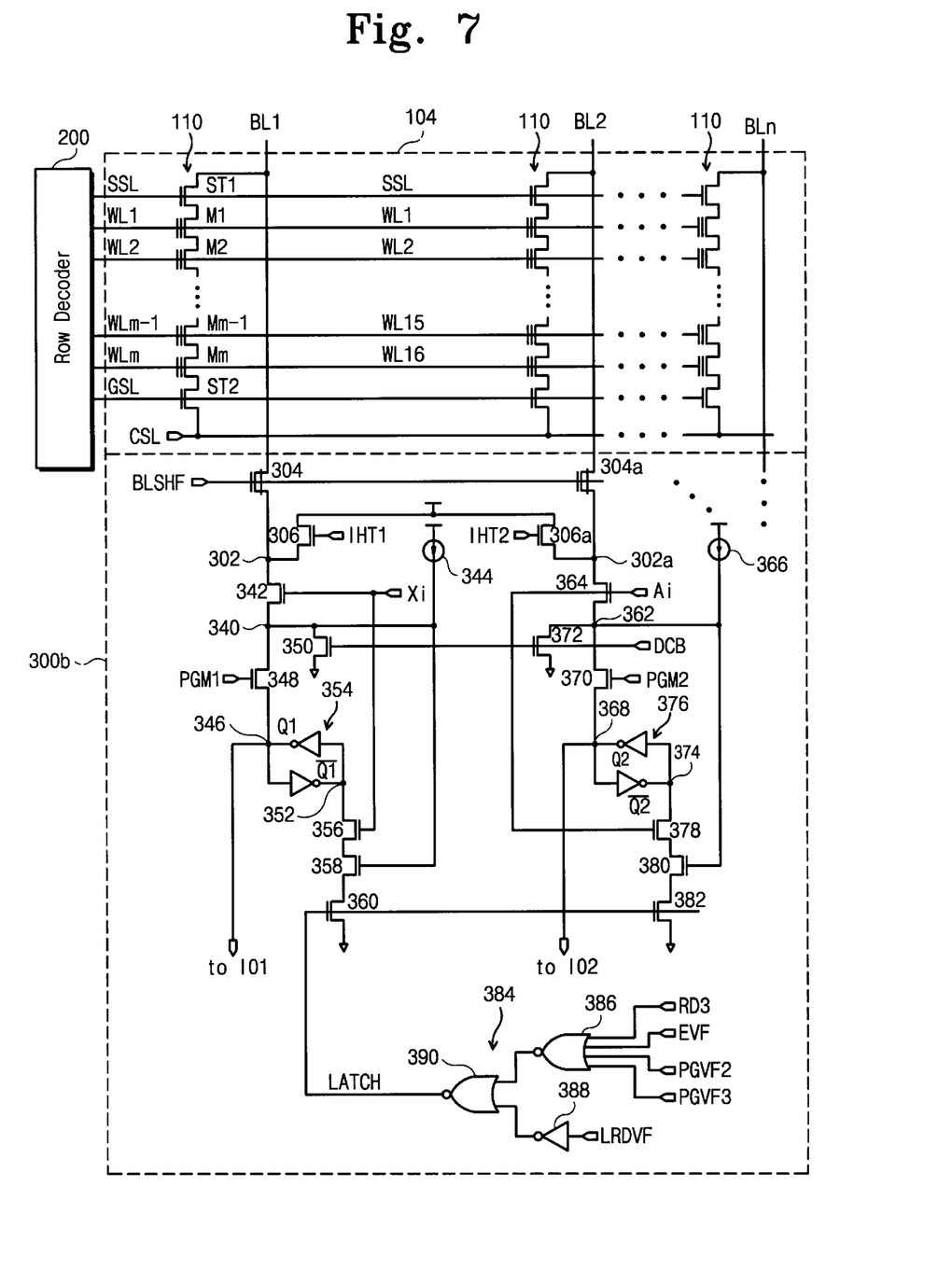
FIG. 7 is a circuit diagram illustrating a redundant field and page buffer circuitry according to a second preferred embodiment of the nonvolatile semiconductor memory shown in FIG. 2.

FIG. 7 shows a memory cell array of the redundant field 104 and a page buffer circuit 300b according to a second preferred embodiment of the present invention. As in the first preferred embodiment, the memory cell array of the redundant field 104 corresponds to a memory sector of the memory field 102 (see FIG. 2). The interconnection between the redundant field 104 and the page buffer circuit 300b differs from the page buffer circuit of the first preferred embodiment, however, by having multiple data latches respectively assigned to each of the bit lines, instead of having only one data latch assigned to all of the bit lines.

Specifically, in the page buffer circuit 300b, a first bit line BL1 is connected to a first node 340 through a first NMOS depletion transistor and a first NMOS transistor 342. A second bit line BL2 is connected to a fourth node 362 through a second NMOS depletion transistor 304a and a second NMOS transistor 364. Gates of both the first and second NMOS depletion transistors 304 and 304a are coupled in common to the bit line shielding signal BLSHF, similar to the first preferred embodiment. Also similar to the first embodiment, a gate of the first NMOS transistor 342 is coupled to an address signal Xi while a gate of the second NMOS transistor 364 is coupled to the address signal Ai. Additionally, a third NMOS transistor 306 has a gate coupled to the first inhibition signal IHT1 and is connected between the power source voltage and a second node 302. The second node is located between the first NMOS and the first NMOS depletion transistors 342 and 304, respectively. Between the power source voltage and a third node 302a, a fourth NMOS transistor 306a is connected. The fourth NMOS transistor has a gate coupled to the second inhibition signal IHT2. The third node is interposed between the second NMOS and the second NMOS depletion transistors 364 and 304a, respectively.

Unlike the first preferred embodiment, however, a fifth NMOS transistor 350, having a gate coupled to the bit line discharge signal DCB is connected between the first node 340 and the ground. A seventh NMOS transistor 372 has a gate coupled to the bit line discharge signal DCB and is connected between the fourth node 362 and the ground. Constant current is supplied to the first node 340 from the power source voltage through a first independent current source 344. Constant current is also supplied to the fourth node 362 from the power source voltage through a second independent current source 366.

The first node 340 is connected to a first terminal Q1 of a first data latch 354 through an eighth NMOS transistor 348. The eighth NMOS transistor 348 has a gate coupled to a first programming signal PGM1. The first terminal Q1 is also connected to a first input/output line 101. A complementary first terminal $\overline{Q1}$ is connected to the ground through ninth, tenth, and eleventh NMOS transistors 356, 358 and 360, respectively. A gate of the ninth NMOS transistor 356 is coupled to address signal Xi, while a gate of the tenth NMOS transistor 358 is connected to the first node 340, and a gate of the eleventh NMOS transistor 360 is coupled to the latch signal LATCH. The fourth node 362 is connected to a second terminal Q2 of a second data latch 376 through a twelfth NMOS transistor 370, having a gate coupled to a second programming signal PGM2. The second terminal Q2 is also connected to a second input/output line IO2. A complementary second terminal $\overline{Q2}$ is connected to the ground through a thirteenth, a fourteenth, and a fifteenth NMOS transistors 378, 380, and 382, respectively. A gate of the thirteenth NMOS transistor 378 is coupled to the address signal Ai, while a gate of the fourteenth NMOS transistor 380 is connected to the fourth node 362, and a gate of the fifteenth NMOS transistor 382 is coupled to the latch signal LATCH. The latch signal LATCH is provided to activate the first and second data latches 354 and 376, respectively, and is generated by a first NOR gate 390 of a latch control circuit 384.

In the latch control circuit 384, a plurality of signals including the read signal RD3, the erasure verification signal EVF, a first program verification signal PGVF2, and a second program verification signal PGVF3, are applied as separate inputs to a second NOR gate 386. An output of the second NOR gate 386 is applied as a first input to the first NOR gate 390, while an inverse of the read verification signal LRDVF is applied to the first NOR gate 390 as a second input.

Figure 8A:
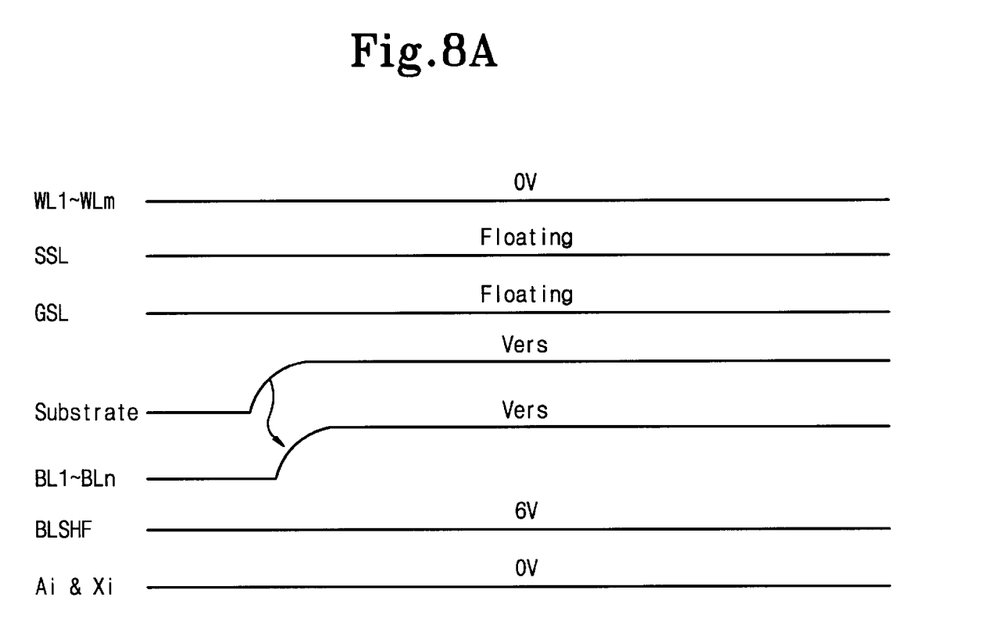
FIG. 8A is a timing diagram illustrating the timing of an erasure operation of the second preferred embodiment of the present invention shown in FIG. 7.
Figure 8B:
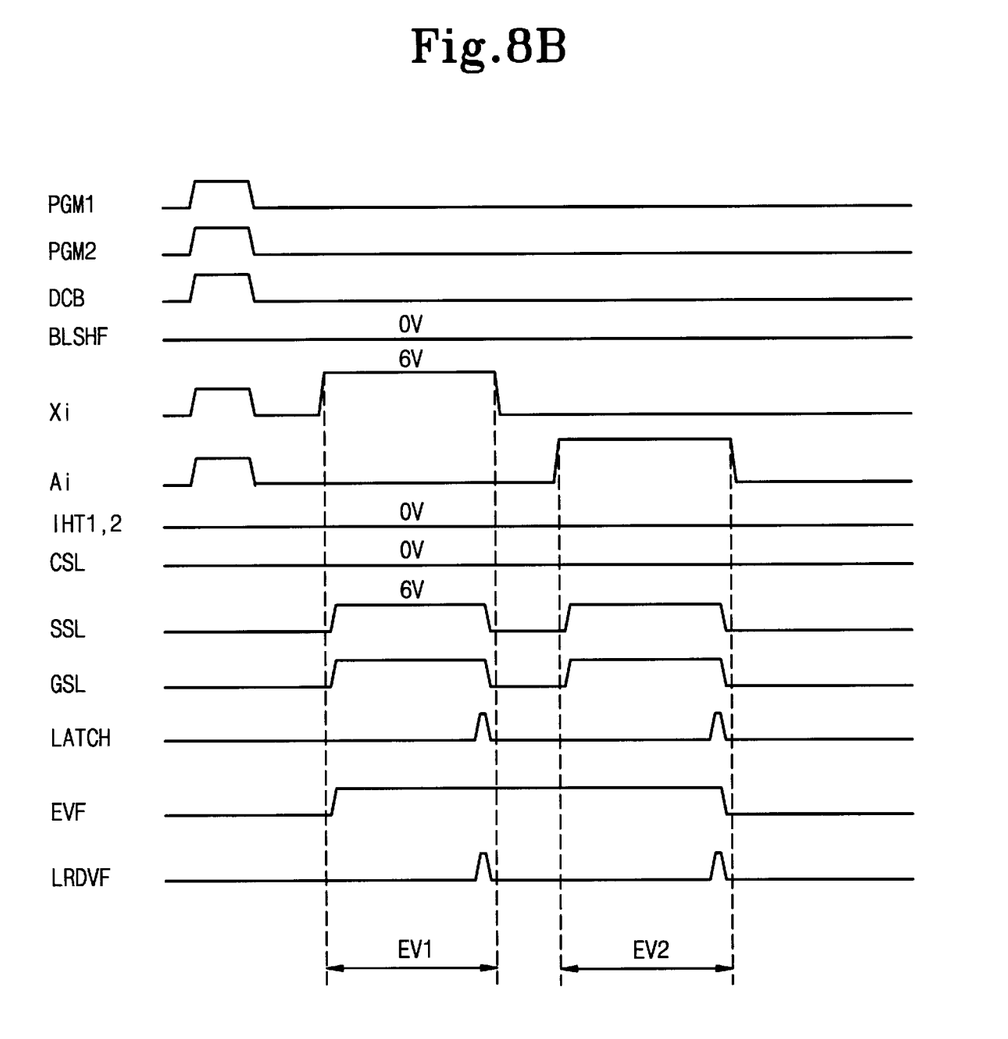
FIG. 8B is a timing diagram showing the timing of an erasure verification operation of the second preferred embodiment of the present invention shown in FIG. 7.

The erasure and erasure verification operations of this embodiment, illustrated in FIGS. 8A and 8B, are the same as those of the first preferred embodiment, illustrated in FIGS. 4A and 4B. A detailed description thereof will therefore be omitted.

Figure 9:
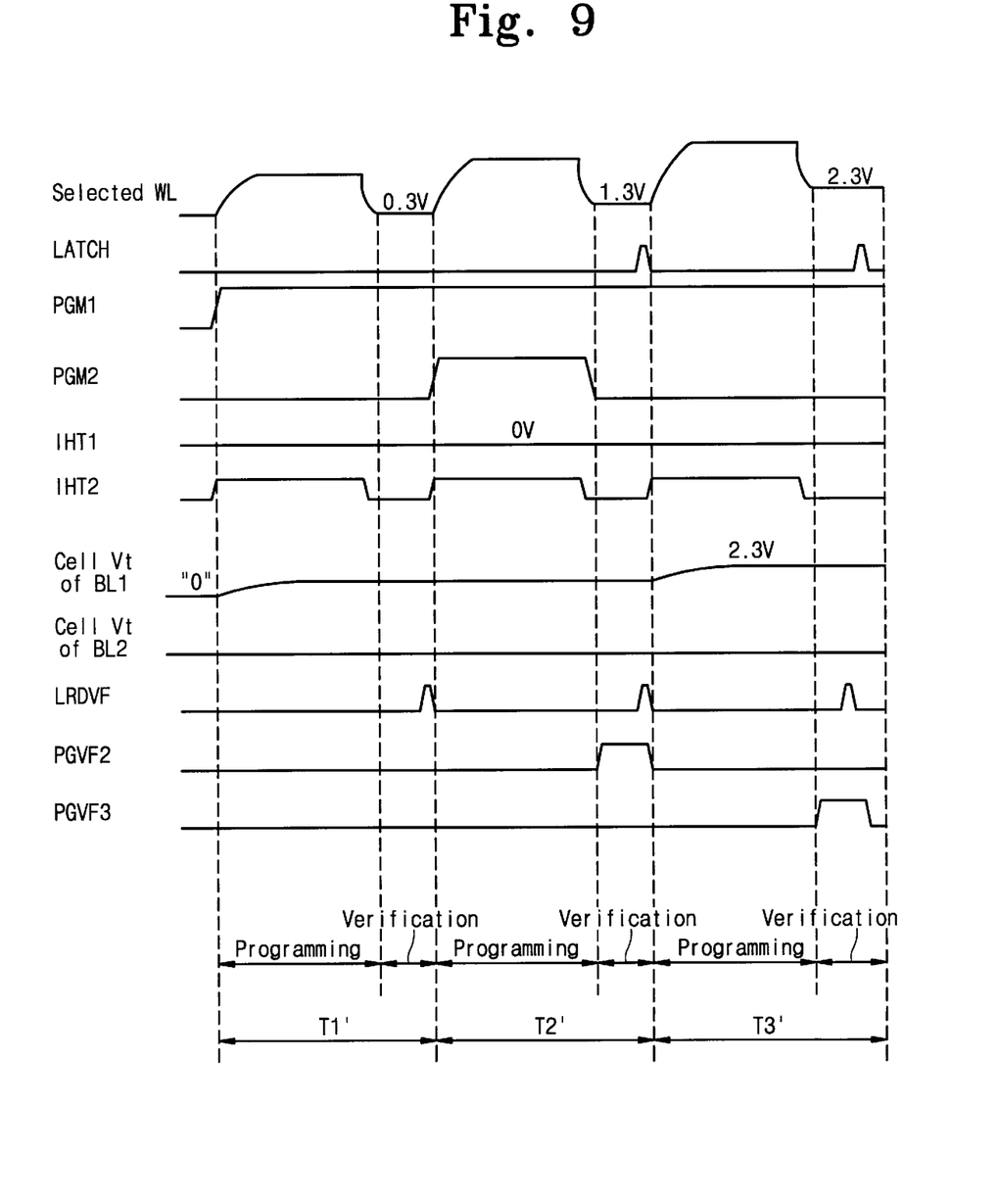
FIG. 9 is a timing diagram showing the timing of a programming and a program verification operation of the second preferred embodiment of the present invention shown in FIG. 7.

Referring to FIGS. 7 and 9, the timing of a programming and a program verification operation of the second preferred embodiment of the present invention will be discussed. Similar to the first embodiment, a timing sequence of the programming and program verification operations of this embodiment include three cycles T1', T2', and T3'.

Specifically, in a programming and a program verification operation for a selected bit line, i.e. the first bit line BL1, of this embodiment, a selected memory cell in the redundant field 104 is programmed and verified during a third cycle T3', in which the selected memory cell is made to have a threshold voltage higher than 2.3V (which is a verification voltage for the third cycle). Even though a programming operation is conducted during the first cycle T1', since the latch signal LATCH is disabled, there is no program verification operation performed for the selected cell in the redundant field 104. A second cycle T2' also cannot include a programming step because the first program signal PGM1 corresponding to the selected bit line BL1 is not activated. However, it may be understood that if the selected bit line is the second bit line BL2, then the programming and program verification operations for the second bit line BL2 are performed during the second cycle T2'.

Figure 10:
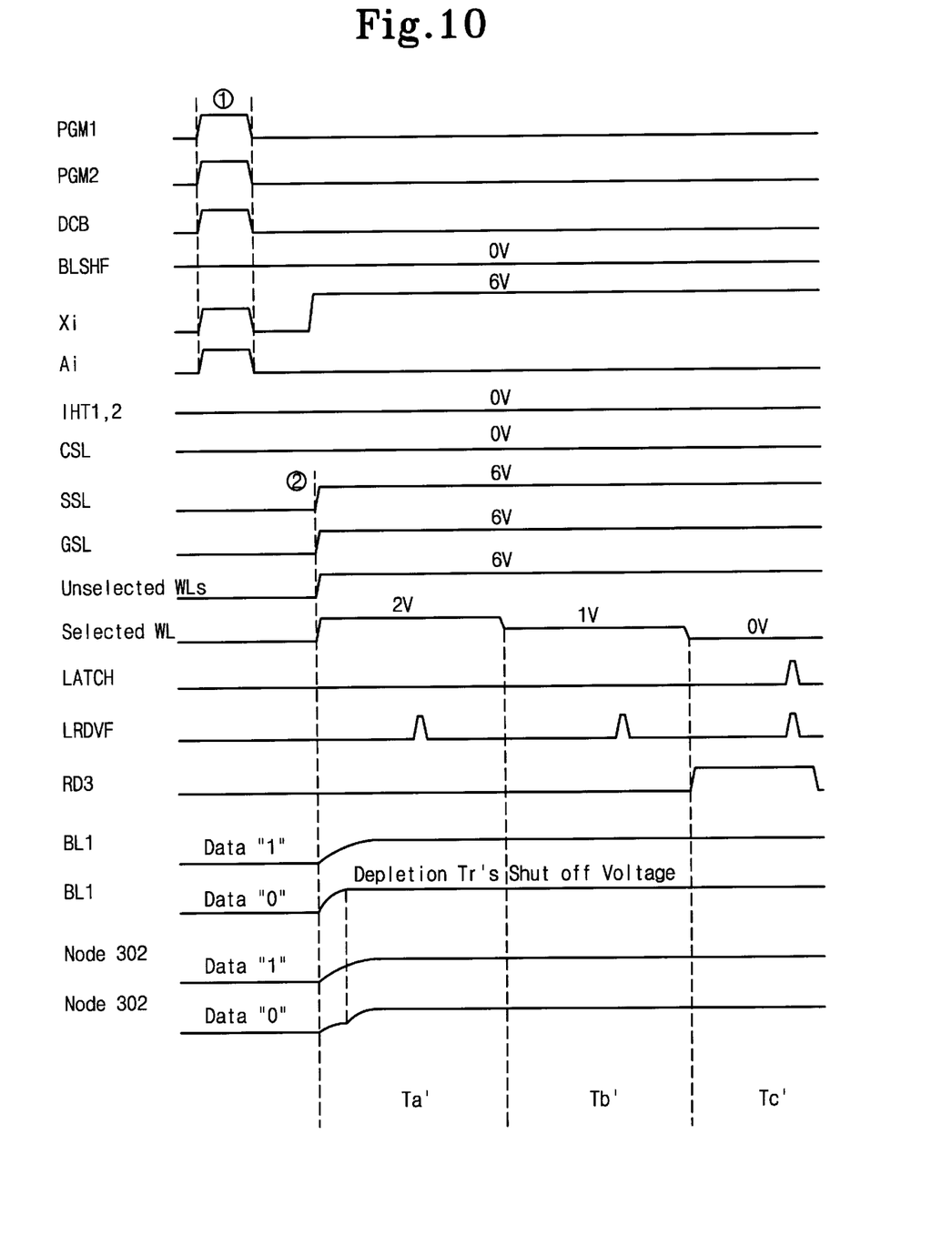
FIG. 10 is a timing diagram illustrating the timing of a read operation of the second preferred embodiment of the present invention shown in FIG. 7.

A reading operation for the redundant field 104 of FIG. 7 is illustrated in FIG. 10 and is the same as that of the first preferred embodiment (see FIG. 6). As in the first preferred embodiment, the reading operation as illustrated in FIG. 10 is carried out during the third cycle Tc$^1$ as determined by the read signal RD3.

As is well known, a voltage margin in performing a reading operation in a single-bit memory is about 1.3V. This is significantly larger than the 0.3V voltage margin that is available in a multi-bit reading operation. This indicates that the stability and reliability for memory stored in a single-bit memory structure is much greater than that of a multi-bit memory structure. The stability of essential information regarding device formulation or address mapping is therefore the greatest when stored in a single-bit cell array. However, multi-bit memories offer greater integration density. This invention incorporates the use of both structures within a single semiconductor chip. Furthermore, this invention allows single-bit operations from a redundant field to be carried out during the conventional sequence of the multi-bit process, without delaying or disturbing the sequential timings of the conventional multi-bit operations. Accordingly, this invention provides a nonvolatile semiconductor memory device that has a memory field and a redundant field and is capable of performing reliable, efficient, and adaptable operations because of both the incorporation of both single-bit and multi-bit memory structures into a single chip and also the efficient page buffer circuitry.

While the present invention has been particularly disclosed with reference to the first and second preferred embodiments thereof, it should be appreciated that many other embodiments and modifications of the invention will be apparent to those skilled in the art that fall within the spirit and scope of the following claims.

What is claimed is:

1. A nonvolatile memory comprising:
   a memory field formed of a plurality of sectors, each sector having a normal cell array and a redundant cell array;
   a redundant field formed of a plurality of sectors corresponding to the sectors of the memory field, each sector having a cell array;
   means for spontaneously erasing all of selected cells in the memory and redundant fields;
   means for programming and verifying against a selected cell belong to the redundant field with a single bit while a selected cell belong to the memory field is being programmed and verified with multiple bits; and
   means for reading a selected cell belong to the redundant field as a single bit while a selected cell belong to the memory field is being read as multiple bits.

2. A nonvolatile semiconductor memory comprising;
   a memory field and a redundant field, the redundant field capable of storing information about device formulation or address mapping;
   a programming circuit capable of programming and verifying single-bit data in a selected memory cell belonging to the redundant field while multi-bit data in a selected memory cell belonging to the memory field is being programmed and verified; and
   a reading circuit capable of reading single-bit data from a selected memory cell belonging to the redundant field while multi-bit data is being read from a selected memory cell belonging to the memory field.

3. The nonvolatile semiconductor memory according to claim 2 wherein the redundant field comprises a plurality of strings configured in a NAND-type flash memory arrangement.

4. The nonvolatile semiconductor memory according to claim 3 wherein each string comprises two string selection transistors and a plurality of memory cells.

5. The nonvolatile semiconductor memory according to claim 2 wherein the redundant field comprises a plurality of bit lines.

6. The nonvolatile semiconductor memory according to claim 5 wherein the programming circuit comprises a page buffer circuit capable of controlling the bit lines within the redundant field.

7. The nonvolatile semiconductor memory according to claim 6 wherein the page buffer circuit comprises:

a first node in communication with a first bit line of the redundant field through a first NMOS transistor and a first NMOS depletion transistor;

the first node in further communication with a second bit line of the redundant field through a second NMOS transistor and a second NMOS depletion transistor;

a gate of each of the first and second NMOS depletion transistors being in common communication with a bit line shielding signal;

a gate of the first NMOS transistor in communication with a first address signal;

a gate of the second NMOS transistor in communication with a second address signal;

a third NMOS transistor, having a gate coupled to receive a first inhibition signal, connected between a power source voltage and a second node, the second node being interposed between the first NMOS and the first NMOS depletion transistors;

a fourth NMOS transistor, having a gate coupled to receive a second inhibition signal, connected between a power source voltage and a third node, the third node located between the second NMOS and the second NMOS depletion transistors;

a fifth NMOS transistor, having a gate coupled to a bit line discharge signal, connected between the first node and a ground;

a data latch having first and second terminals, the first node also in communication with the first terminal of the data latch through a sixth NMOS transistor, the sixth NMOS transistor having a gate coupled to receive a programming signal PGM, and the first terminal being in further communication with an input/output line, the second terminal of the data latch being in communication with the ground through seventh and eighth NMOS transistors, the seventh NMOS transistor having a gate coupled to receive a signal, and the eighth NMOS transistor having a gate in communication with the first node;

the signal being generated by a first NOR gate of a latch control circuit, and being provided to activate a data latch.

8. A nonvolatile semiconductor memory according to claim 7 in which the latch control circuit is configured to receive a plurality of signals, the plurality of signals comprising a read signal, an erasure verification signal, and a program verification signal, each signal being applied to a respective terminal of a second NOR gate; an output of the second NOR gate being applied as a first input to a first NOR gate; and the inverse of a read verification signal being applied as a second input to the first NOR gate.

9. The nonvolatile semiconductor memory according to claim 6, wherein the page buffer circuit comprises a data latch.

10. The nonvolatile semiconductor memory according to claim 6, wherein the page buffer circuit comprises a separate data latch for each of the bit lines.

11. A nonvolatile semiconductor memory comprising:

a nonvolatile memory cell array having a plurality of memory fields which consist of multi-bit cells and store normal data, and a plurality of redundant fields which consist of single-bit cells and store device data;

a plurality of first page buffers coupled to the memory fields, respectively, for performing multi-bit data programming and programming verification operations for selected ones of the multi-bit cells; and a plurality of second page buffers coupled to the redundant fields, respectively, for performing single-bit data programming and programming verification operations for selected ones of the single-bit cells;

wherein the single-bit programming and programming verification operations of the second page buffers are performed using the same sequential timing as the multi-bit programming and programming verification operations of the first page buffers.

12. The nonvolatile semiconductor memory according to claim 11, wherein the first page buffers perform a multi-bit reading operation for the selected multi-bit cells, and the second page buffers perform a single-bit reading operation for the selected single-bit cells.

13. The nonvolatile semiconductor memory according to claim 12, wherein the single-bit reading operation of the second page buffers is performed using the same sequential timing as the multi-bit reading operation of the first page buffers.

* * * * *

UNITED STATES PATENT AND TRADEMARK OFFICE
CERTIFICATE OF CORRECTION

PATENT NO. : 5,982,663
DATED : November 9, 1999
INVENTOR(S) : Park

It is certified that error appears in the above-identified patent and that said Letters Patent is hereby corrected as shown below:

Column 8,
Line 29, "depletion transistor" should read -- depletion transistor 304 --.
Line 65, "101" should read -- I01 --.

Signed and Sealed this

Twentieth Day of August, 2002

Attest:

Attesting Officer

JAMES E. ROGAN
Director of the United States Patent and Trademark Office